US012399244B2

(12) United States Patent
Van Liere et al.

(10) Patent No.: US 12,399,244 B2
(45) Date of Patent: Aug. 26, 2025

(54) PHASE-COHERENT READ-OUT OF MRI SENSOR NODES

(71) Applicant: KONINKLIJKE PHILIPS N.V., Eindhoven (NL)

(72) Inventors: Filips Van Liere, Best (NL); Cumhur Erdin, Eindhoven (NL); Sotir Filipov Ouzounov, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 177 days.

(21) Appl. No.: 18/280,692

(22) PCT Filed: Mar. 3, 2022

(86) PCT No.: PCT/EP2022/055330
§ 371 (c)(1),
(2) Date: Sep. 7, 2023

(87) PCT Pub. No.: WO2022/189233
PCT Pub. Date: Sep. 15, 2022

(65) Prior Publication Data
US 2024/0142552 A1 May 2, 2024

(30) Foreign Application Priority Data
Mar. 11, 2021 (EP) ..................................... 21161983

(51) Int. Cl.
*G01R 33/36* (2006.01)
(52) U.S. Cl.
CPC ................................ *G01R 33/3621* (2013.01)
(58) Field of Classification Search
CPC ............................ G01R 33/3621; G01R 33/36
See application file for complete search history.

(56) References Cited

U.S. PATENT DOCUMENTS

| 10,429,460 B2 | 10/2019 | Ouzounov |
| 2003/0155981 A1 | 8/2003 | Dey |

(Continued)

FOREIGN PATENT DOCUMENTS

| EP | 0223136 A2 | 5/1987 | |
| EP | 3285438 A1 * | 2/2018 | ........... H04L 12/427 |

(Continued)

OTHER PUBLICATIONS

International Search Report and Written Opinion from PCT/EP2022/055330 mailed May 20, 2022.

*Primary Examiner* — G. M. A Hyder

(57) ABSTRACT

The invention relates to phase-coherent read-out of sensor nodes (3) of a magnetic resonance imaging system (1) with a digital serial communication network (2). According to the invention, the network (2) comprises multiple sensor nodes (3) for detecting a radio frequency signal from a patient who is under examination by the magnetic resonance imaging system (1), and a host node (4) which is connected to the sensor nodes (3) via a network link (5) for merging and processing digital sensor data received from the sensor nodes (3), wherein the host node (4) comprises a receiver (6) connected to the network link (5) for receiving data over the network link (5), and a transmitter (7) connected to the network link (5) for transmitting data over the network link (5), the sensor nodes (3) each comprise an analog-to-digital converter (8) for converting the detected radio frequency signal to the digital sensor data, a receiver (9) connected to the network link (5) for receiving data over the network link (5), a transmitter (10) connected to the network link (5) for transmitting data over the network link (5), and a clock and data recovery unit (11) with a clock device which is configured for miming on a preset free-running frequency, the frequency of the data transmission over the network link (5) is set to a fixed frequency relative to the preset free-running (Continued)

frequency of the clock devices, and the clock and data recovery units (11) are configured for generating a recovered clock signal for controlling the analog-to-digital converter (8) of their sensor node by regulating the frequency of the clock device of their sensor node (3) to lock to the frequency of the data transmission over the network link (5). In this way, the possibility of phase coherent sensory data acquisition with a magnetic resonance imaging system (1) is provided in a robust and cost-efficient way.

14 Claims, 3 Drawing Sheets

(56) References Cited

U.S. PATENT DOCUMENTS

| | | |
|---|---|---|
| 2008/0136417 A1 | 6/2008 | Baumgartl et al. |
| 2010/0117649 A1 | 5/2010 | Nakanshi et al. |
| 2016/0169991 A1 | 6/2016 | Kato et al. |

FOREIGN PATENT DOCUMENTS

| | | |
|---|---|---|
| JP | 11290292 A | 10/1999 |
| WO | 2009074924 A1 | 6/2009 |
| WO | 2011073880 A1 | 6/2011 |
| WO | 2013061272 A1 | 5/2013 |
| WO | 2015197720 A1 | 12/2015 |

* cited by examiner

PHASE-COHERENT READ-OUT OF MRI SENSOR NODES

CROSS REFERENCE TO RELATED APPLICATIONS

This application is a U.S. national phase application of International Application No. PCT/EP2022/055330 filed Mar. 3, 2022, which claims the benefit of EP Application Serial No. 21161983.8 filed on Mar. 11, 2021 and is incorporated herein by reference.

FIELD OF THE INVENTION

The invention relates to the field of magnetic resonance imaging (MRI) systems and methods, and in particular to a magnetic resonance imaging system with a digital serial communication network and a respective method for controlling such a system.

BACKGROUND OF THE INVENTION

MR systems, like MR imaging systems, use multiple magnetic loop antennas or coil elements, also called sensor nodes, to detect a radio frequency (RF) signal from a patient. In modern MR systems, the received RF signal is immediately digitized at each sensor node. The sensor nodes transmit the digital data to a host, where the sensor data is merged for subsequent processing and image reconstruction.

Phase coherent MR signal acquisition is required for artefact-free image reconstruction. With the increase of the number of coil elements, it becomes increasingly difficult to maintain phase coherent signal acquisition.

The process of recovering the clock and data from the encoded serial bit-stream is referred to as clock and data recovery (CDR). Traditional CDR circuits make use of a clock reference to provide an initial frequency to capture the incoming clock. For example, a phase locked loop (PLL) in the CDR circuit is used to lock the local clock of the sensor node to the clock from the incoming bit-stream.

To ensure artifact free image reconstruction, the relative phases of the signals acquired by individual coil elements must remain constant, a condition referred to as phase coherency. This translates to a phase coherency requirement on the sampling clocks of the analog-to-digital convertors (ADCs) in each sensor node and a controlled phase offset between the clock recovered by the CDR from the incoming data and the clock used in the high-speed readout.

From WO 2013/061272 A1 a data communication system and a method that can particularly be applied for communicating data from a medical instrument like a catheter or a guide-wire via a high-speed link are known. The system comprises a slave component with a controllable slave clock and a transmitter for transmitting a data signal that is clocked by the slave clock signal. Moreover, it comprises a master component with a clock controller that receives a master clock signal and the data signal and that generates a clock control signal for adjusting the slave clock to the master clock. The slave clock may thus be realized with low space and energy requirements, e.g. by a voltage controlled oscillator. Moreover, the link via which the data signal and the clock control signal are exchanged may be realized by just two signal wires.

SUMMARY OF THE INVENTION

It is an object of the invention to provide the possibility of phase coherent sensor data acquisition with a magnetic resonance imaging system in a robust and cost-efficient way.

According to the invention, this object is addressed by the subject matter of the independent claims. Preferred embodiments of the invention are described in the dependent claims.

Therefore, according to the invention, a magnetic resonance imaging system with a digital serial communication network is provided, wherein the network comprises multiple sensor nodes for detecting a radio frequency signal from a patient who is under examination by the magnetic resonance imaging system, and a host node which is connected to the sensor nodes via a network link for merging and processing digital sensor data received from the sensor nodes, wherein the host node comprises a receiver connected to the network link for receiving data over the network link, and a transmitter connected to the network link for transmitting data over the network link, the sensor nodes each comprise an analog-to-digital converter for converting the detected radio frequency signal to the digital sensor data, a receiver connected to the network link for receiving data over the network link, a transmitter connected to the network link for transmitting data over the network link, and a clock and data recovery unit with a clock device which is configured for running on a preset free-running frequency, the frequency of the data transmission over the network link is set to a fixed frequency relative to the preset free-running frequency of the clock devices, and the clock and data recovery units are configured for generating a recovered clock signal for controlling the analog-to-digital converter of their sensor node by regulating the frequency of the clock device of their sensor node to lock to the frequency of the data transmission over the network link.

Here, the term "their sensor node" in respect of the term "clock and data recovery units" means the sensor node to which the respective clock and data recovery units belongs. Hence, the clock recovery is performed separately for each sensor node by the respective sensor node itself. Conventional solutions for clock recovery require local clock references commonly in the form of a crystal oscillator. The use of crystal oscillators is both costly and unreliable in an MR environment. According to the invention, the use of local clock references can be avoided if at each sensor node the clock is recovered from the incoming data. Therefore, according to the invention, the usage of a clock and data recovery units is proposed which are able to recover the clock directly from the input data stream without requiring a reference clock; i.e. to lock the local clock to the system clock without resorting to a crystal oscillator reference at each sensor node. Hence, the sensor network according to the invention does not use local or external clock references.

The magnetic resonance imaging system of the invention is provided with a digital serial communication network formed with a ring network topology with sensor nodes and a host node for merging and processing digital sensor data received from the sensor nodes, which makes use of unit directional communication between nodes. The sensor nodes each comprise inter alia an analogue to digital converter and a clock and data recovery unit with a clock device which is configured for running on a preset free running frequency. The clock and data recovery units are configured for generating a recovered clock signal for controlling the analog to digital converter of their sensor node by regulating the frequency of the clock device of their sensor node to lock to the frequency of the data transmission over the network link and variations in clock phase due the operational conditions are compensated by detecting variations in propagation delay around the ring in the host node and adjusting each local clock phase of the acquired signal's phase.

Though, in this way, the sensor nodes may not be synchronized to each other it is possible to ensure that all sensor nodes run on the same rate. In other words, the sensor nodes work with a fixed but undefined phase difference relative to each other. Therefore, according to the invention, it is ensured that the clock recovery operates reliably over variations in frequency due to process, voltage and temperature (PVT) variations. Since transmission delay over the network link typically varies with PVT variations, compensating these variations helps reducing or even avoiding artefacts in the acquired MR images. In this respect, the invention offers the possibility of compensating any variations in clock phase due the operational conditions by detecting variations in propagation delay around the network in the host node and adjusting each local clock phase of acquired signal phase.

The digital serial link according to the invention offers the possibility of using encoding schemes to enable recovering the clock used to transmit the data. The recovered clock may subsequently be used to reliably retrieve the transmitted data. The use of such data encoding enables transmission of both clock and data over the same serial link in a single serial bit-stream.

In general, the clock units of the sensor nodes may be designed in different ways. However, according to a preferred embodiment of the invention, the clock device of each data recovery unit comprises a phase-locked loop circuit having a voltage-controlled oscillator which is configured for running on the preset free-running frequency, and the clock and data recovery units are configured for generating the recovered clock signal for controlling the analog-to-digital converter of their sensor node by regulating the frequency of the voltage-controlled oscillators of their sensor node to lock to the frequency of the data transmission over the network link. According to a preferred embodiment of the invention, the phase-locked loop circuit comprises a clock divider which is arranged downstream from the voltage-controlled oscillator. This enables usage of high frequency voltage-controlled oscillators to reduce phase noise or ease implementation challenges. This preferred embodiment of the invention leads to a data frequency which is a fraction of the frequency of the voltage-controlled oscillator.

Further, according to a preferred embodiment of the invention, the transmitters of the sensor nodes are configured for transmitting the recovered clock signal to the respective next node in the network over the network link. In this respect, according to a preferred embodiment of the invention, an accurately phased aligned version of the input clock, also called "recovered clock", is used to transmit the data further to the next node in the network.

Though the frequency of the data transmission over the network link may be set to different values, according to a preferred embodiment of the invention, the frequency of the data transmission over the network link is set to be higher than the preset free-running frequency of the phase locked loop circuit. Further, according to a preferred embodiment of the invention, the host node comprises a clock reference unit for providing a clock reference for the network.

The present invention pertains to a magnetic resonance imaging system with a digital serial communication network formed with a ring network topology with sensor nodes and a host node for merging and processing digital sensor data received from the sensor nodes, which makes use of unit directional communication between nodes. The sensor nodes each comprise inter alia an analogue to digital converter and a clock and data recovery unit with a clock device which is configured for running on a preset free running frequency. The clock and data recovery units are configured for generating a recovered clock signal for controlling the analog to digital converter of their sensor node by regulating the frequency of the clock device of their sensor node to lock to the frequency of the data transmission over the network link and variations in clock phase due the operational conditions are compensated by detecting variations in propagation delay around the ring in the host node and adjusting each local clock phase of the acquired signal's phase.

According to a preferred embodiment of the invention, the host node and the sensor nodes are arranged in a ring network topology, wherein each sensor node is linked to two other sensor nodes or to a sensor node and the host node via a respective uni-directional digital serial sublink of the network link. Cabling in the MRI scanner bore is very challenging towards realizing safety and reliability as for galvanic cables special design approaches are required compatible with the strong magnetic fields in an MRI scanner. The use of optical connections avoids problems associated with galvanic cabling but poses its own problems due to power consumption, physical size and reliability of MR compatible optical transceivers. A typical conventional network topology is a star network with bi-directional communication between network nodes. Though, in general, this type of star network topology may be used for the present invention, it is more preferred to use a ring network topology which makes use of uni-directional communication between nodes, significantly reducing the amount of network cabling. A ring network topology is an efficient way for building a sensor network with a minimal amount of data and power cabling. The ring network furthermore facilitates the detection and compensation of variations in signal propagation delays.

The invention further pertains to a radio frequency (RF) receiver array comprising multiple sensor nodes with a digital serial communication network as defined in claim 14. The RF receiver array may be employed in an magnetic resonance imaging system to receive magnetic resonance signals from a patient to be examined on the basis of MR images. The RF receiver array of the invention may be a component of the magnetic resonance imaging system, or may be employed as a replacement component in servicing or upgrading the magnetic resonance imaging system. The RF receiver array of the invention may also be provided with RF transmission functionality to form an RF transmission/receiver array.

Further, according to the invention, a method for controlling a magnetic resonance imaging system is provided which comprises a digital serial communication network, the method comprising the following method steps:
  detecting a radio frequency signal from a patient who is under examination by the magnetic resonance system with multiple sensor nodes,
  converting the detected radio frequency signal to digital sensor data with a respective analog-to-digital converter in each sensor node,
  transmitting the digital sensor data from the sensor nodes to a host node,
  providing a clock and data recovery unit in each sensor node which comprises a clock device which runs on a preset free-running frequency, and
  generating a recovered clock signal in each sensor node for controlling the analog-to-digital converter of the respective sensor node by regulating the frequency of the respective clock device to lock to the frequency of the data transmission wherein the frequency of the data transmission is set to a fixed frequency relative to the preset free-running frequency of the clock devices.

According to a preferred embodiment of the invention, the clock device of each data recovery unit comprises a phase-locked loop circuit having a voltage-controlled oscillator which runs on the preset free-running frequency, and the method comprises the following method step:

generating the recovered clock signals for controlling the respective analog-to-digital converters by regulating the frequency of each voltage-controlled oscillator to lock to the frequency of the data transmission.

Further, it is preferred that the method comprises the following method step:

transmitting the recovered clock signal from a sensor node to the respective next node in the network.

According to a preferred embodiment of the invention, the frequency of the data transmission is set to be higher than the preset free-running frequency of the phase locked loop circuit.

Furthermore, according to a preferred embodiment of the invention, the method comprises the following method step:

providing a clock reference for the network from the host node to the sensor nodes.

The invention also relates to a non-transitory computer-readable medium, comprising instructions stored thereon, that when executed on a processor induce a magnetic resonance imaging system as described above to perform a method as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
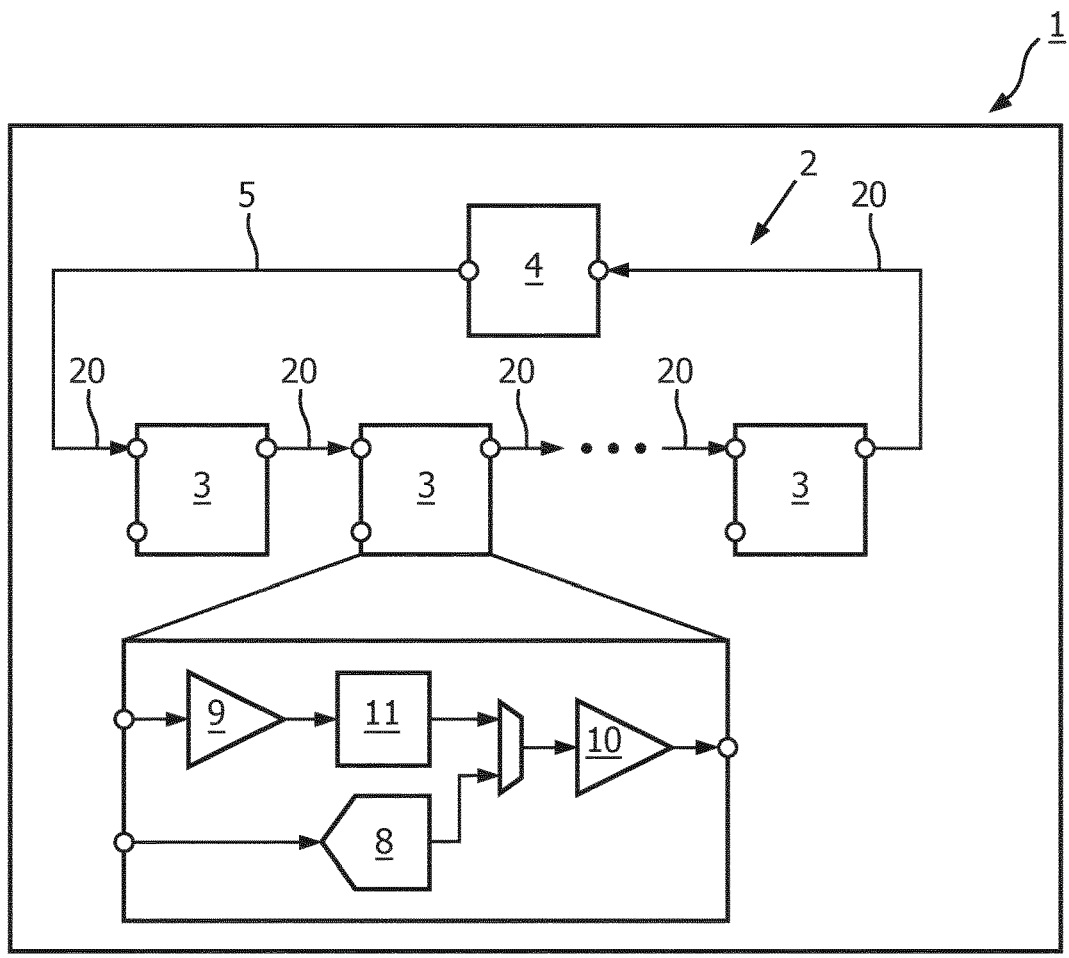
FIG. 1 schematically depicts a digital serial communication network of a magnetic resonance imaging system according to a preferred embodiment of the invention, FIG. 2 schematically depicts a clock and data recovery unit of a sensor node of a digital serial communication network of a magnetic resonance imaging system according to a preferred embodiment of the invention.

In FIG. 1, a magnetic resonance imaging system 1 according to a preferred embodiment of the invention with a digital serial communication network 2 with a ring network topology is depicted. The network 2 comprises multiple sensor nodes 3 for detecting a radio frequency signal from a patient (not depicted) who is under examination by the magnetic resonance imaging system 1. Further, the network 2 comprises a host node 4 which is connected to the sensor nodes 3 via a network link 5 for merging and processing digital sensor data received from the sensor nodes 3. According to the preferred embodiment of the invention described here, each sensor node 3 is linked to two other sensor nodes 3 or to a sensor node 3 and the host node 4 via a respective uni-directional digital serial sublink 20 of the network link 5. Such a ring network topology significantly decreases the number and lengths of cables required to connect an array of sensor nodes 3. Each sensor node 3 is linked to two other sensor nodes 3 or to one sensor node 3 and the host node 4. The network link 5 has sufficient bandwidth to transport simultaneously the sensor data of all sensor nodes 3 in the ring to the host node 4 where the data is further processed.

Figure 4:
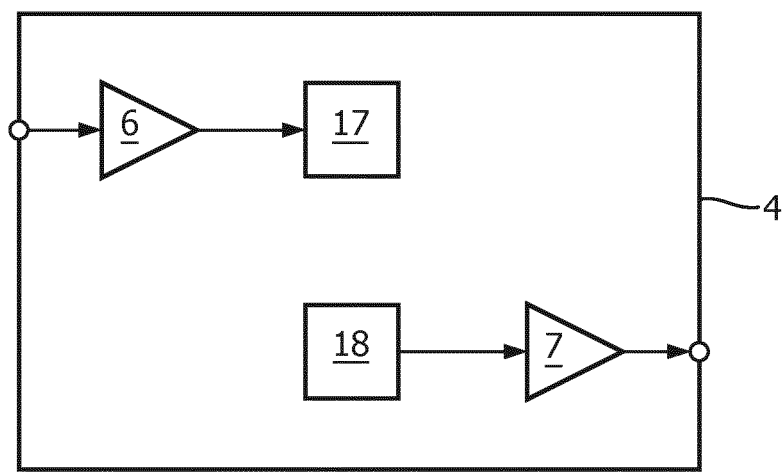

As depicted in FIG. 4, the host node 4 comprises a receiver 6 connected to the network link 5 for receiving data over the network link 5 and a transmitter 7 connected to the network link 5 for transmitting data over the network link 5. Further, the host node 4 comprises a processing unit 17 for merging and processing the data received form the sensor nodes 3, and a clock reference unit 18 for providing a clock reference for the network 2.

As can be seen from FIG. 1 the sensor nodes 3 each comprise an analog-to-digital converter 8 for converting the detected radio frequency signal to the digital sensor data, a receiver 9 connected to the network link 5 for receiving data over the network link 5, a transmitter 10 connected to the network link 5 for transmitting data over the network link 5, and a clock and data recovery unit 11 with a clock device which is configured for running on a preset free-running frequency.

The application of the preferred embodiment of the invention described here requires that the sampling process is synchronous over all sensor nodes 3; i.e. the acquired radio frequency signals from the patient are phase coherent. This is realized according to the preferred embodiment of the invention described here by ensuring that all analog-to-digital converters 8 clocks are phase locked. Any variations in clock phase due the operational conditions are compensated by detecting variations in propagation delay around the ring in the host node 4 and adjusting each local clock phase of acquired signal phase.

Figure 2:
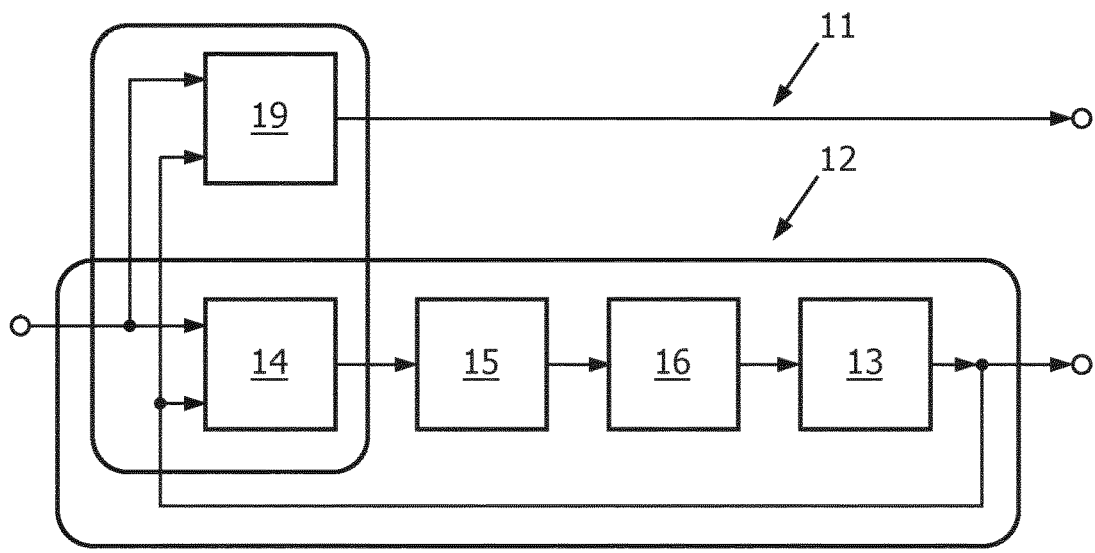

As depicted in FIG. 2, the clock device of each data recovery unit 11 is comprised of a phase-locked loop circuit 12 having a voltage-controlled oscillator 13, which is configured for running on a preset free-running frequency, a phase detector 14, a charge pump 15, a loop filter 16 and a data re-clocking unit 19. Further, the frequency of the data transmission over the network link 5 is set to a fixed frequency relative to this preset free-running frequency of the voltage-controlled oscillator 13. Furthermore, the clock and data recovery units 11 are configured for generating the recovered clock signal for controlling the analog-to-digital converter 8 of their sensor node 3 by regulating the frequency of the clock device of their sensor node 3 to lock to the frequency of the data transmission over the network link 5. In this respect, the incoming data stream provides phase and frequency information to the phase detector 14. The phase detector 14 compares this with a divided output signal of the voltage-controlled oscillator 13. The close-loop control ensures phase and frequency lock to the incoming clock. The recovered clock is subsequently used to reliably sample the received data stream in re-clock data block. According to the preferred embodiment of the invention described here, this is achieved by operating the network link 5 to operate at a fixed known frequency relative to the default free-running frequency of the voltage-controlled oscillators 13 of the phase-locked loop circuits 12.

Therefore, each sensor node 3 comprises local clock and data recovery functionality due to their respective clock and data recovery units 11. The clock and data recovery unit 11 is able to recover the clock from the network link 5 without a local reference in the form of crystal or reference oscillator. In this respect, the network link speed is chosen to be higher than the local frequency of the voltage-controlled oscillator 13 in a free running mode. In the clock and data recovery unit 11, the local frequency the voltage-controlled oscillator 13 is regulated to lock to the frequency of the incoming data, wherein in each sensor node 3, the recovered clock is used locally for clocking the analog-to-digital converter 8 and, optionally, additional digital logic. Further, an accurately phased aligned version of the input clock, the so-called recovered clock, is used to transmit the data further to the next sensor node 3 in the ring by data re-clocking unit 19.

Figure 3:
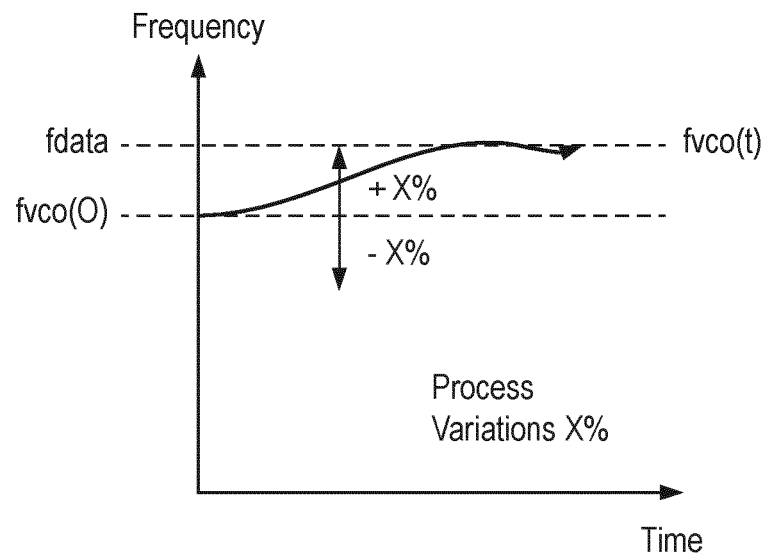
FIG. 3 depicts a frequency locking scheme according to a preferred embodiment of the invention to overcome process variations, FIG. 4 schematically a host node of a digital serial communication network of a magnetic resonance imaging system according to a preferred embodiment of the invention, and FIG. 5 schematically depicts a clock and data recovery unit of a sensor node of a digital serial communication network of a magnetic resonance imaging system according to a another preferred embodiment of the invention.

FIG. 3 illustrates the technique to configure the free-running frequency of the voltage-controlled oscillators 13 of the phase-locked loop circuits 12 to ensure that the clock recovery operates reliably over variations in frequency of the voltage-controlled oscillators 13 of the phase-locked loop circuits 12 due to process, voltage and temperature (PVT) variations. It is known that a linear phase detector intrinsically has a one-sided locking property. When the initial frequency of the voltage-controlled oscillators 13 of the phase-locked loop circuits 12 (fvco(0)) is lower than the input data frequency (fdata), the closed loop clock and data recovery unit 11 is able to obtain frequency and phase lock under all conditions. The initial free-running frequency of the voltage-controlled oscillators 13 can be set by design to conform to this condition. Using this technique provides for reliable operation, i.e. frequency and phase lock by design. In addition to this feature, the technique and architecture uses a single loop to obtain frequency and phase lock, and does not require an additional loop for frequency lock. Since no such additional loop for frequency lock is required the design is simplified.

Figure 5:
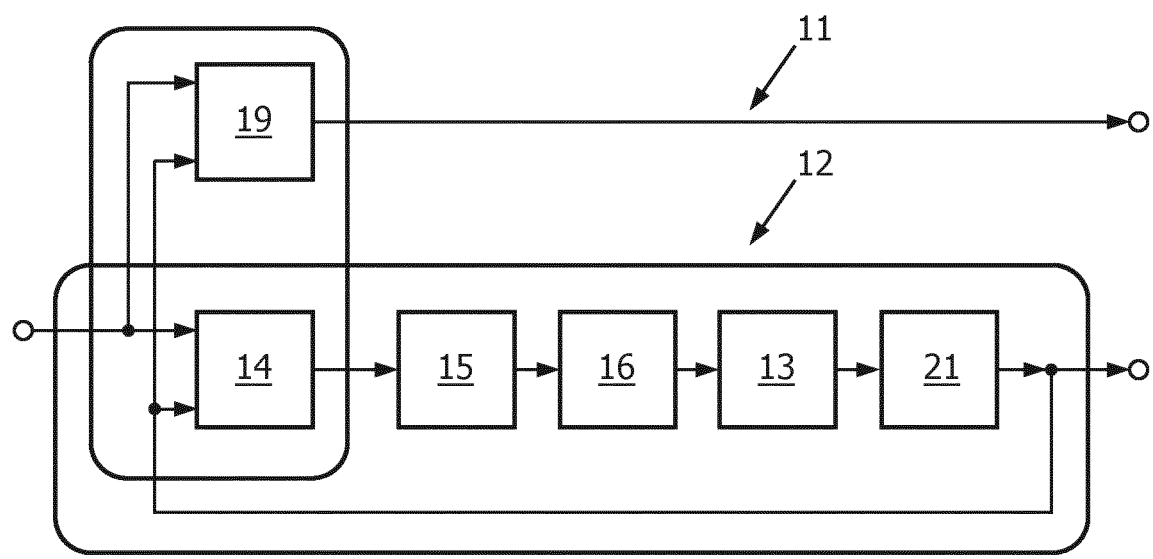

In FIG. 5 another preferred embodiment of the invention is shown wherein the phase-locked loop circuit 12 comprises a clock divider 21 which is arranged downstream from the voltage-controlled oscillator 13. This enables the usage of higher frequency for the voltage-controlled oscillator 13 to reduce phase noise or ease implementation challenges. This preferred embodiment of the invention leads to a data frequency which is a fraction of the frequency of the voltage-controlled oscillator 13.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST magnetic resonance imaging system 1
digital serial communication network 2
sensor node 3
host node 4
network link 5
receiver of the host node 6
transmitter of the host node 7
analog-to-digital converter 8
receivers of the sensor node 9
transmitters of the sensor 10
clock and data recovery unit 11
phase-locked loop circuit 12
voltage-controlled oscillator 13
phase detector 14
charge pump 15
loop filter 16
processing unit 17
clock reference unit 18
data re-clocking unit 19
sublink 20
clock divider 21

The invention claimed is:

1. A magnetic resonance imaging system with a digital serial communication network, wherein the network comprises:

multiple sensor nodes for detecting a radio frequency signal from a patient who is under examination by the magnetic resonance imaging system, and a host node which is connected to the sensor nodes via a network link for merging and processing digital sensor data received from the sensor nodes, formed with a ring network topology which makes use of uni-directional communication between nodes wherein the host node comprises a receiver connected to the network link for receiving data over the network link, and a transmitter connected to the network link for transmitting data over the network link, the sensor nodes each comprise an analog-to-digital converter for converting the detected radio frequency signal to the digital sensor data, a receiver connected to the network link for receiving data over the network link, a transmitter connected to the network link for transmitting data over the network link, and a clock and data recovery unit with a clock device which is configured for running on a preset free-running frequency, the frequency of the data transmission over the network link is set to a fixed frequency relative to the preset free-running frequency of the clock devices, and the clock and data recovery units are configured for generating a recovered clock signal for controlling the analog-to-digital converter of their sensor node by regulating the frequency of the clock device of their sensor node to lock to the frequency of the data transmission over the network link, and wherein variations in clock phase due to the network's operational conditions are compensated by detecting variations in propagation delay around the ring in the host node and adjusting each local clock phase of the detected signal's phase.

2. The magnetic resonance imaging system according to claim 1, wherein the clock device of each data recovery unit comprises a phase-locked loop circuit having a voltage-controlled oscillator, which is configured for running on the preset free-running frequency, and the clock and data recovery units are configured for generating the recovered clock signal for controlling the analog-to-digital converter of their sensor node by regulating the frequency of the voltage-controlled oscillators of their sensor node to lock to the frequency of the data transmission over the network link.

3. The magnetic resonance imaging system according to claim 2, wherein the frequency of the data transmission over the network link is set to be higher than the preset free-running frequency of the phase locked loop circuit.

4. The magnetic resonance imaging system according to claim 1, wherein the transmitters of the sensor nodes are configured to transmit the recovered clock signal to the respective next node in the ring network over the network link.

5. The magnetic resonance imaging system according to claim 1, wherein the host node comprises a clock reference unit for providing a clock reference for the network.

6. The magnetic resonance imaging system according to claim 1, wherein the host node and the sensor nodes are arranged in the ring network topology, wherein each sensor node is linked to two other sensor nodes or to a sensor node and the host node via a respective uni-directional digital serial sublink.

7. A method for controlling a magnetic resonance imaging system which comprises a digital serial communication network formed with a ring network topology which makes use of uni-directional communication between nodes, the method comprising the following method steps:
   detecting a radio frequency signal from a patient who is under examination by the magnetic resonance system with multiple sensor nodes,
   converting the detected radio frequency signal to digital sensor data with a respective analog-to-digital converter in each sensor node,
   transmitting the digital sensor data from the sensor nodes to a host node,
   providing a respective clock and data recovery unit in each sensor node which comprises a clock device which is configured to run on a preset free-running frequency, and
   generating a recovered clock signal in each sensor node for controlling the analog-to-digital converter of the respective sensor node by regulating the frequency of the respective clock device to lock to the frequency of the data transmission wherein the frequency of the data transmission is set to a fixed frequency relative to the preset free running frequency of the clock devices,
   compensate variations in clock phase due the operational conditions e by detecting variations in propagation delay around the ring in the host node and adjusting each local clock phase of the acquired signal's phase.

8. The method according to claim 7, wherein the clock device of each data recovery unit comprises a phase-locked loop circuit having a voltage-controlled oscillator which runs on the preset free-running frequency, and the method comprises the following method step:
   generating the recovered clock signals for controlling the respective analog-to-digital converters by regulating the frequency of each voltage-controlled oscillator to lock to the frequency of the data transmission.

9. The method according to claim 7, further comprising the following method step:
   transmitting the recovered clock signal from a sensor node to the respective next node in the network.

10. The method according to claim 7, wherein the frequency of the data transmission is set to be higher than the preset free-running frequency of the phase locked loop circuit.

11. The method according to claim 7, further comprising the following method step:
   providing a clock reference for the network from the host node to the sensor nodes.

12. The method according to claim 7, wherein the host node and the sensor nodes are arranged in a ring network topology, wherein each sensor node is linked to two other sensor nodes or to a sensor node and the host node.

13. A non-transitory computer-readable medium, comprising instructions stored thereon, that when executed on a processor induce a magnetic resonance imaging system to perform a method for controlling the magnetic resonance imaging system which comprises a digital serial communication network formed with a ring network topology which makes use of uni-directional communication between nodes, the method comprising:
   detecting a radio frequency signal from a patient who is under examination by the magnetic resonance system with multiple sensor nodes,
   converting the detected radio frequency signal to digital sensor data with a respective analog-to-digital converter in each sensor node,
   transmitting the digital sensor data from the sensor nodes to a host node,
   providing a respective clock and data recovery unit in each sensor node which comprises a clock device which is configured runs on to run on a preset free running frequency, and
   generating a recovered clock signal in each sensor node for controlling the analog-to-digital converter of the respective sensor node by regulating the frequency of the respective clock device to lock to the frequency of the data transmission wherein the frequency of the data transmission is set to a fixed frequency relative to the preset free running frequency of the clock devices,
   compensate variations in clock phase due the operational conditions e by detecting variations in propagation delay around the ring in the host node and adjusting each local clock phase of the acquired signal's phase.

14. A radio frequency receiver array comprising multiple sensor nodes with a digital serial communication network, wherein the network comprises:
   multiple sensor nodes for detecting a radio frequency signal from a patient who is under examination by the magnetic resonance imaging system, and
   a network link for connecting a host node to the sensor nodes via the network link for merging and processing digital sensor data received from the sensor nodes, formed with a ring network topology which makes use of uni-directional communication between nodes wherein
   the host node comprises a receiver connected to the network link for receiving data over the network link, and a transmitter connected to the network link for transmitting data over the network link,
   the sensor nodes each comprise an analog-to-digital converter for converting the detected radio frequency signal to the digital sensor data, a receiver connected to the network link for receiving data over the network link, a transmitter connected to the network link for transmitting data over the network link, and a clock and data recovery unit with a clock device which is configured for running on a preset free-running frequency,
   the frequency of the data transmission over the network link is set to a fixed frequency relative to the preset free-running frequency of the clock devices, and
   the clock and data recovery units are configured for generating a recovered clock signal for controlling the analog-to-digital converter of their sensor node by regulating the frequency of the clock device of their sensor node to lock to the frequency of the data transmission over the network link, and wherein variations in clock phase due the operational conditions are compensated by detecting variations in propagation delay around the ring in the host node and adjusting each local clock phase of the acquired signal's phase.

* * * * *